United States Patent
Iida et al.

(10) Patent No.: US 8,390,370 B2
(45) Date of Patent: *Mar. 5, 2013

(54) FILTER CIRCUIT AND COMMUNICATION DEVICE

(75) Inventors: Sachio Iida, Chiba (JP); Atsushi Yoshizawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 143 days.

This patent is subject to a terminal disclaimer.

(21) Appl. No.: 12/614,684

(22) Filed: Nov. 9, 2009

(65) Prior Publication Data

US 2010/0156564 A1 Jun. 24, 2010

(30) Foreign Application Priority Data

Dec. 22, 2008 (JP) ................................ 2008-326199

(51) Int. Cl.
*H03K 5/00* (2006.01)
(52) U.S. Cl. ........................................ 327/554; 327/552
(58) Field of Classification Search .......... 327/551–559, 327/336–337

See application file for complete search history.

(56) References Cited

U.S. PATENT DOCUMENTS 4,508,982 A * 4/1985 Kapral et al. .................. 327/384
5,336,242 A * 8/1994 Zadeh ............................. 607/11

OTHER PUBLICATIONS

U.S. Appl. No. 12/608,535, filed Oct. 29, 2009, Iida, et al.
U.S. Appl. No. 12/627,399, filed Nov. 30, 2009, Iida, et al.
S. Manetti, et al., "Switched-capacitor lowpass filter without active components," Electronics Letters, Nov. 6, 1980, vol. 16, No. 23, pp. 883-885.

* cited by examiner

*Primary Examiner* — Dinh T. Le
(74) *Attorney, Agent, or Firm* — Oblon, Spivak, McClelland, Maier & Neustadt, L.L.P.

(57) ABSTRACT

There is provided a filter circuit that includes: a flying capacitor which maintains polarity when switching from an input terminal to an output terminal, and the polarity of which is reversed when switching from the output terminal to the input terminal; a first capacitor that is provided in parallel with the flying capacitor, at the input terminal of the flying capacitor; and a second capacitor that is provided in parallel with the flying capacitor, at the output terminal of the flying capacitor. The flying capacitor is switched from the input terminal to the output terminal with a delay of a predetermined time after the switching from the output terminal to the input terminal, and the flying capacitor is switched from the output terminal to the input terminal with a delay of a predetermined time after the switching from the input terminal to the output terminal.

6 Claims, 9 Drawing Sheets

FILTER CIRCUIT AND COMMUNICATION DEVICE

BACKGROUND OF THE INVENTION

1. Field of the Invention

The present invention relates to a filter circuit and a communication device.

2. Description of the Related Art

The power supply voltage of a radio frequency (RF) circuit tends to decrease along with miniaturization of a complementary metal oxide semiconductor (CMOS) process. Due to the miniaturization of the CMOS process, if an RF circuit is mounted using a known circuit technique, a voltage margin becomes insufficient and the dynamic range of the signal amplitude is narrowed. Meanwhile, the cut-off frequency of a transistor increases due to the miniaturization of the CMOS process, which is advantageous for operations in which high-speed switching operations are performed accurately at a precise timing. In addition, it is also advantageous that the capacitor ratio becomes accurate due to highly accurate lithography.

A digital RF technology is a new technology that introduces the concept of discrete time signal processing to the RF circuit, in order to avoid the problems that may be caused as a result of the miniaturization of the CMOS process and to obtain the advantages. A charge domain filter is used as a main circuit in the digital RF technology field. The charge domain filter is a filter circuit that is formed by a transconductance amplifier, switches and capacitors. The charge domain filter performs sampling of analog signals by accumulating and discharging electric charges in synchronization with a clock, and performs filtering, decimation and the like using discrete time signal processing.

As a known example of the charge domain filter, there is a charge domain second order infinite impulse response low pass filter (IIR-LPF) such as that described in S. Manetti and A. Liberatore, "Switched-capacitor lowpass filter without active components," Electron. Lett., 1980, 16, pp. 883-885. The charge domain second order IIR-LPF is advantageous in that it can be realized by a simple charge domain circuit.

SUMMARY OF THE INVENTION

However, with the known charge domain second order IIR-LPF provided with a flying capacitor that is described in "Switched-capacitor lowpass filter without active components," the Q value of the filter is approximately 0.7 to 0.8 and attenuation characteristics are moderate in the vicinity of the cut-off frequency. Therefore, with the known charge domain second order IIR-LPF provided with the flying capacitor, a filter having steep characteristics cannot be structured.

In light of the foregoing, it is desirable to provide a novel and improved filter circuit and communication device that are capable of having steep attenuation characteristics and further capable of changing the Q value, in a charge domain second order IIR-LPF provided with a flying capacitor.

According to an embodiment of the present invention, there is provided a filter circuit including a flying capacitor which maintains polarity when switching from an input terminal to an output terminal, and the polarity of which is reversed when switching from the output terminal to the input terminal, a first capacitor that is provided in parallel with the flying capacitor, at the input terminal of the flying capacitor, and a second capacitor that is provided in parallel with the flying capacitor, at the output terminal of the flying capacitor. The flying capacitor is switched from the input terminal to the output terminal with a delay of a predetermined time after the switching from the output terminal to the input terminal, and the flying capacitor is switched from the output terminal to the input terminal with a delay of a predetermined time after the switching from the input terminal to the output terminal.

With the above-described structure, the flying capacitor maintains the polarity when switching from the input terminal to the output terminal, and the polarity of the flying capacitor is reversed when switching from the output terminal to the input terminal. The first capacitor is provided in parallel with the flying capacitor, at the input terminal of the flying capacitor, and the second capacitor is provided in parallel with the flying capacitor, at the output terminal of the flying capacitor. The flying capacitor is switched from the input terminal to the output terminal with the delay of a predetermined time after the switching from the output terminal to the input terminal, and the flying capacitor is switched from the output terminal to the input terminal with the delay of a predetermined time after the switching from the input terminal to the output terminal. As a consequence, owing to the delay when switching from the input terminal to the output terminal and the delay when switching from the output terminal to the input terminal, it is possible to vary the Q value in addition to providing steep attenuation characteristics, in the charge domain second order IIR-LPF provided with the flying capacitor.

The flying capacitor may be switched from the input terminal to the output terminal with a delay of J clocks, J being a natural number of 1 or more, of a clock cycle input to the flying capacitor after the switching from the output terminal to the input terminal, and the flying capacitor is switched from the output terminal to the input terminal with a delay of K clocks, K being a natural number of 1 or more, of the clock cycle after the switching from the input terminal to the output terminal.

The value of J may be variable. The value of J may be variable, and a sum of J and K may be constant. The value of J may be variable, and a value of K may be constant.

According to an embodiment of the present invention, there is provided a communication device including a filter circuit including a flying capacitor which maintains polarity when switching from an input terminal to an output terminal, and the polarity of which is reversed when switching from the output terminal to the input terminal, a first capacitor that is provided in parallel with the flying capacitor, at the input terminal of the flying capacitor, and a second capacitor that is provided in parallel with the flying capacitor, at the output terminal of the flying capacitor. The flying capacitor is switched from the input terminal to the output terminal with a delay of a predetermined time after the switching from the output terminal to the input terminal, and the flying capacitor is switched from the output terminal to the input terminal with a delay of a predetermined time after the switching from the input terminal to the output terminal.

According to the embodiments of the present invention described above, it is possible to provide a novel and improved filter circuit and communication device that are capable of having steep attenuation characteristics and further capable of changing the Q value, in a charge domain second order IIR-LPF provided with a flying capacitor.

DETAILED DESCRIPTION OF THE EMBODIMENT(S)

Figure 1:
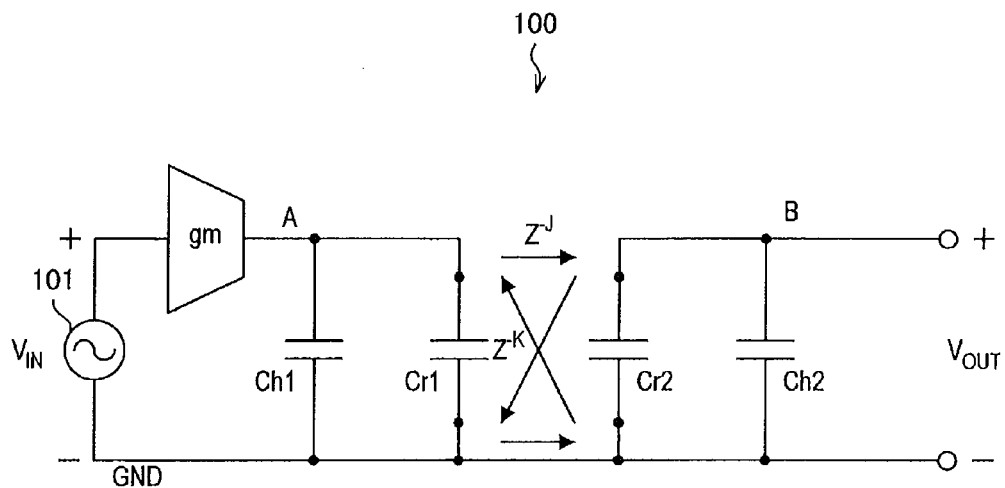
FIG. 1 is an explanatory diagram showing the structure of a charge domain infinite impulse response low pass filter (IIR-LPF) 100 according to an embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

An exemplary embodiment of the present invention will be described in detail in the following order.

1. Charge domain second order IIR-LPF according to related art
  1-1. Structure of charge domain second order IIR-LPF according to related art
  1-2. Problems of charge domain second order IIR-LPF according to related art
2. LPF according to embodiment of the present invention
  2-1. Structure of LPF according to embodiment of the present invention
  2-2. Transfer function of LPF according to embodiment of the present invention
  2-3. Frequency characteristics of LPF according to embodiment of the present invention
  2-4. Example of circuit structure of LPF according to embodiment of the present invention
3. Communication device provided with LPF according to embodiment of the present invention
4. Conclusion 1. Charge Domain Second Order IIR-LPF According to Related Art First, before describing the exemplary embodiment of the present invention, a charge domain filter according to related art will be described, and then problems thereof will be described.

1-1. Structure of Charge Domain Second Order IIR-LPF According to Related Art

Figure 7:
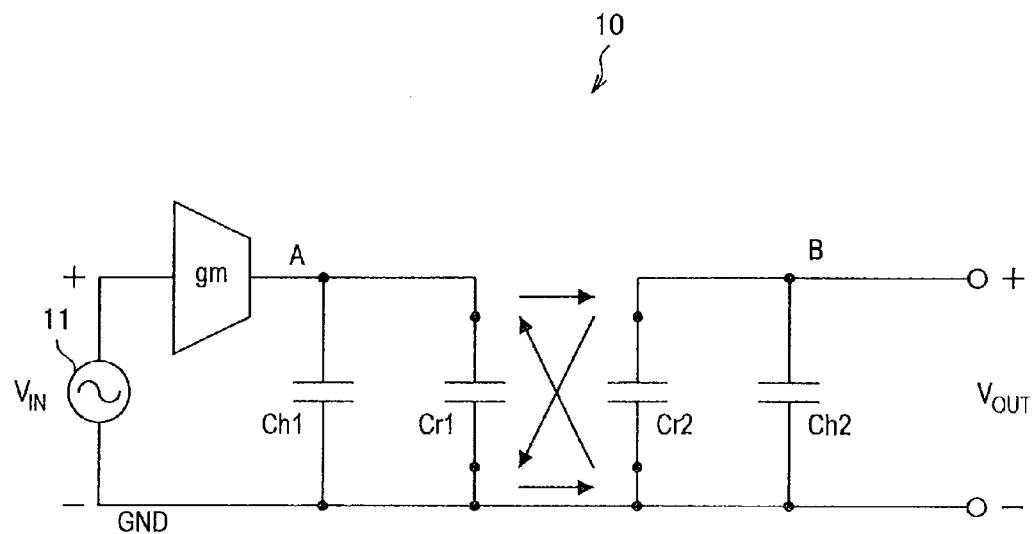
FIG. 7 is an explanatory diagram showing the structure of a charge domain second order IIR-LPF 10 according to related art.

FIG. 7 is an explanatory diagram showing the structure of a charge domain second order infinite impulse response low pass filter (IIR-LPF) 10 according to the related art, which is described in S. Manetti and A. Liberatore, "Switched-capacitor lowpass filter without active components," Electron. Lett., 1980, 16, pp. 883-885. Hereinafter, the structure of the charge domain second order IIR-LPF 10 according to the related art will be described with reference to FIG. 7.

As shown in FIG. 7, the charge domain second order IIR-LPF 10 according to the related art includes a power source 11, a transconductance amplifier gm, and capacitors Ch1, Ch2, Cr1 and Cr2.

The power source 11 is an AC power source, and outputs an input voltage signal $V_{IN}$. The transconductance amplifier gm is a transconductance amplifier that converts a voltage signal to a current signal and outputs it. The transconductance amplifier gm outputs, to an A point in FIG. 7, a current with an amplitude proportional to the input voltage signal $V_{IN}$ from the power source 11, and charges the capacitor Ch1.

The capacitors Cr1 and Cr2 move alternately between an A point side and a B point side in synchronization with a clock input to the LPF 10. Because of the capacitors Cr1 and Cr2 moving alternately between the A point side and the B point side, an electric charge can be transferred and received between the capacitor Ch1 and the capacitor Ch2. As a result, the capacitor Ch2 is charged, a voltage is generated at the B point in FIG. 7, and it is possible to output an output voltage signal $V_{OUT}$.

Figure 8:
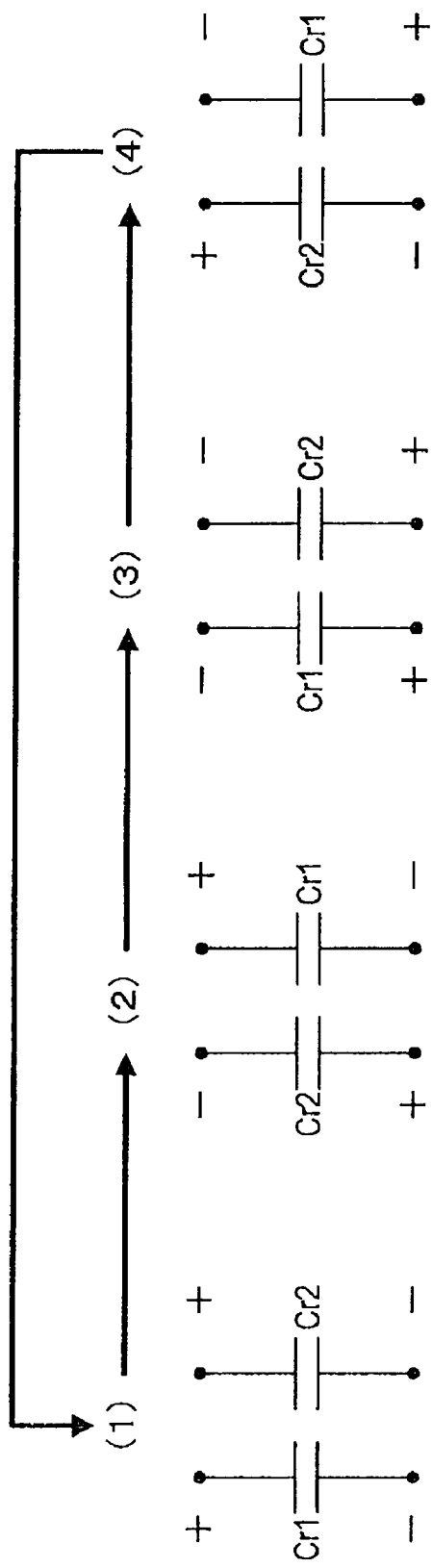
FIG. 8 is an explanatory diagram showing the regularity of movement of capacitors Cr1 and Cr2 shown in FIG. 7.

Here, the regularity of movement of the capacitors Cr1 and Cr2 will be described with reference to FIG. 8. When the capacitors Cr1 and Cr2 move from the A point side to the B point side in FIG. 7, the capacitors Cr1 and Cr2 move in parallel with each other while maintaining the same polarity. On the other hand, when the capacitors Cr1 and Cr2 move from the B point side to the A point side in FIG. 7, the capacitors Cr1 and Cr2 move while reversing the polarity. FIG. 8 shows a manner in which the capacitors Cr1 and Cr2 move, and the capacitors Cr1 and Cr2 are denoted with positive and negative codes that indicate their respective polarities. For explanatory convenience, (1) in FIG. 8 is referred to as a first state. In the first state, the capacitor Cr1 is located on the A side in FIG. 7, and the capacitor Cr2 is located on the B side in FIG. 7, the capacitors Cr1 and Cr2 both having a positive polarity.

Next, for explanatory convenience, (2) in FIG. 8 is referred to as a second state. In the second state, the capacitor Cr1 has moved such that the B side in FIG. 7 has a positive polarity. Meanwhile, the capacitor Cr2 has moved such that the A side in FIG. 7 has a negative polarity, namely, the polarity is reversed.

Next, for explanatory convenience, (3) in FIG. 8 is referred to as a third state. In the third state, the capacitor Cr2, the polarity of which was reversed in the second state, has moved such that the B side in FIG. 7 has a negative polarity. Meanwhile, the capacitor Cr1 has moved such that the A side in FIG. 7 has a negative polarity, namely, the polarity is reversed.

Next, for explanatory convenience, (4) in FIG. 8 is referred to as a fourth state. In the fourth state, the capacitor Cr1, the polarity of which was reversed in the third state, has moved such that the B side in FIG. 7 has a negative polarity. Meanwhile, the capacitor Cr2 has moved such that the A side in FIG. 7 has a positive polarity, namely, the polarity is reversed.

Then, in a state following the fourth state, the capacitor Cr2 has moved such that the B side in FIG. 7 has a positive polarity. Meanwhile, the capacitor Cr1 has moved such that the A side in FIG. 7 has a positive polarity, namely, the polarity is reversed. This is the same state as the first state. As the first state to the fourth state are repeated in synchronization with the clock in this manner, an electric charge can be transferred and received between the capacitor Ch1 and the capacitor Ch2.

Figure 9:
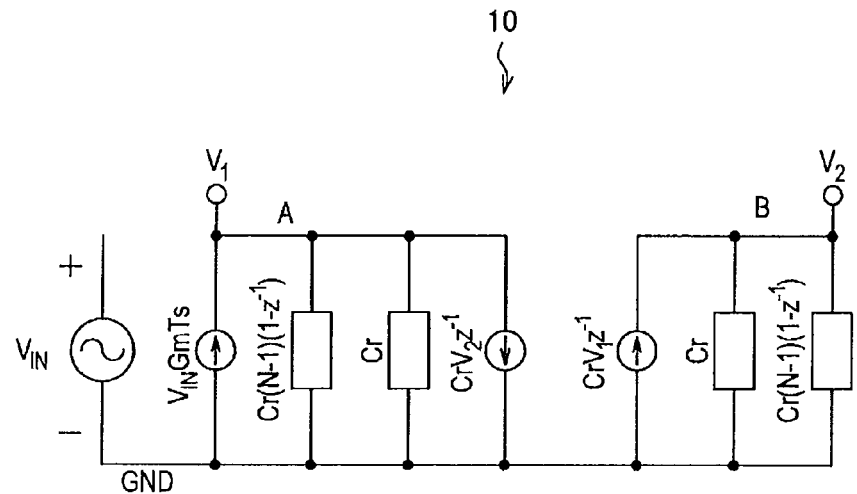
FIG. 9 is an explanatory diagram showing an equivalent circuit that is obtained by converting the LPF 10 shown in FIG. 7 to a z-domain equivalent circuit.

In order to obtain a transfer function of the LPF 10 shown in FIG. 7, the LPF 10 is converted to a z-domain equivalent circuit. FIG. 9 is an explanatory diagram showing an equivalent circuit that is obtained by converting the LPF 10 shown in FIG. 7 to the z-domain equivalent circuit. In the diagram shown in FIG. 9, the sampling clock cycle is denoted by Ts, the capacities of the capacitors Cr1 and Cr2 are both denoted by Cr, and the capacities of the capacitors Ch1 and Ch2 are both denoted by Cr(N−1). Further, current sources illustrated in FIG. 9 indicate that current flows in an arrow direction per one sample, and rectangles illustrated in FIG. 9 indicate conductances.

When a voltage $V_1$ at an A point in FIG. 9 and a voltage $V_2$ at a B point in FIG. 9 are calculated according to Kirchhoff's first law, the following Expression 1 and Expression 2 are obtained.

$$V_1 = \frac{V_{IN} \cdot Gm \cdot Ts/Cr - V_2 \cdot z^{-1}}{(N-1)\cdot(1-z^{-1})+1} \quad \text{Expression 1}$$

$$V_2 = \frac{V_1 \cdot z^{-1}}{(N-1)\cdot(1-z^{-1})+1} \quad \text{Expression 2}$$

When $V_2/V_{IN}$ is obtained from the above Expression 1 and Expression 2, the following Expression 3 is obtained.

$$\frac{V_2}{V_{IN}} = \frac{Gm \cdot Ts}{Cr} \cdot \frac{z^{-1}}{\{N-(N-1)\cdot z^{-1}\}^2 + z^{-2}} \quad \text{Expression 3}$$

If an approximate mapping from z-space to s-space is performed using bilinear transformation with respect to the above Expression 3, it is possible to obtain the pole and the Q value of the filter. The pole of the filter is expressed by Expression 4 below, and the Q value of the filter is expressed by Expression 5 below, respectively.

$$\text{Pole} = \frac{1}{\pi \cdot Ts \cdot \sqrt{2 \cdot N^2 - 2 \cdot N + 1}} \quad \text{Expression 4}$$

$$Q = \frac{\sqrt{2 \cdot N^2 - 2 \cdot N + 1}}{2 \cdot (N-1)} \quad \text{Expression 5}$$

The capacities of the capacitors Ch1 and Ch2 are both (N−1) times the capacity of the capacitor Cr. Accordingly, if the capacities of the capacitors Ch1 and Ch2 are both denoted by Ch, a relationship of N=Ch/Cr+1 is established. When these capacitors are used in the second order IIR-LPF, if the value of N is set to about 5 to 23, the range of the Q value is 0.8 to 0.723, and if the filter is normalized by setting Fs=1/Ts, the range of the pole is 0.05 Fs to 0.01 Fs. Note that, in accordance with an increase in the value of N, the Q value asymptotically approaches $\sqrt{2}/2$.

Figure 10:
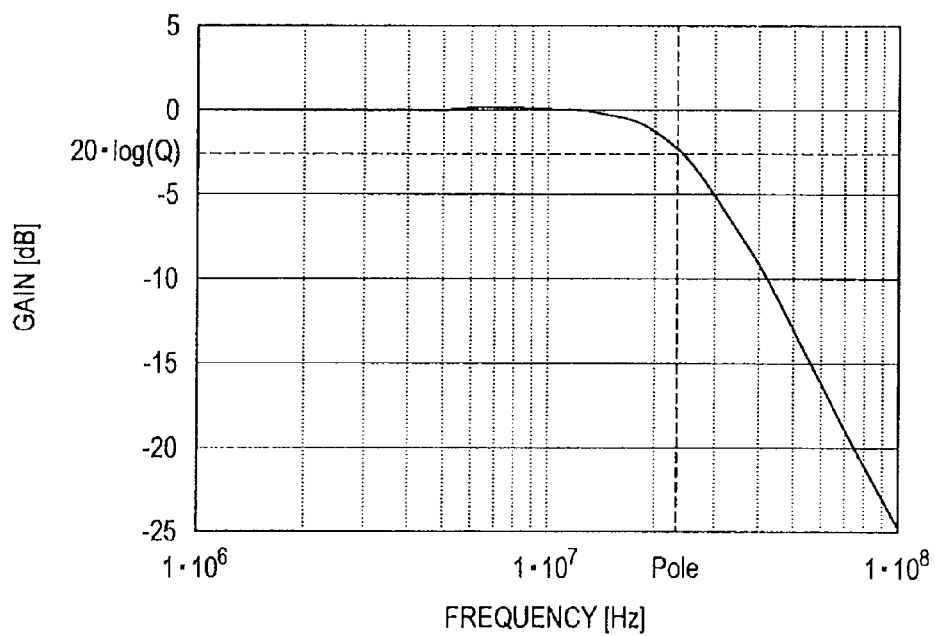
FIG. 10 is an explanatory diagram showing frequency characteristics of the LPF 10.

N=10, Ts=1.0 [ns], Gm=1.0 [mS], Ch=4.5 [pF] and Cr=0.5 [pF] are set the LPF 10 shown in FIG. 7. Further, if it is taken into account that the charge sampling by the clock is performed in a rectangular time window and frequency characteristics of the LPF 10 are obtained from the above Expression 3, the frequency characteristics shown in FIG. 10 are obtained. Further, dotted lines in FIG. 10 indicate the pole and the Q value that are respectively obtained from the above Expression 4 and Expression 5. When N=10 and Ts=1.0 [ns], Pole=23.66 [MHz] and Q=0.747.

Figure 11:
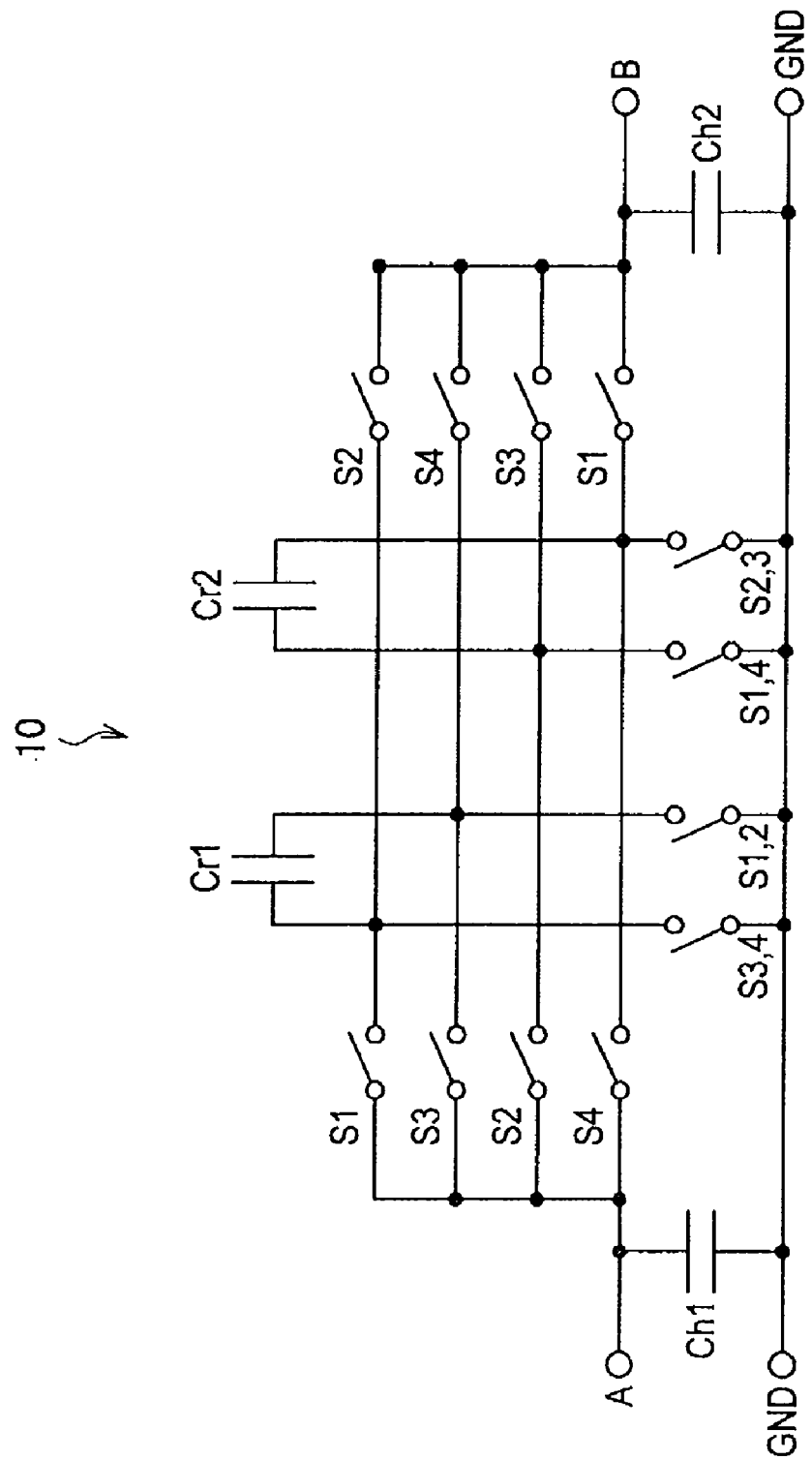
FIG. 11 is an explanatory diagram showing an actual circuit structure of the LPF 10 shown in FIG. 7.
Figure 12:
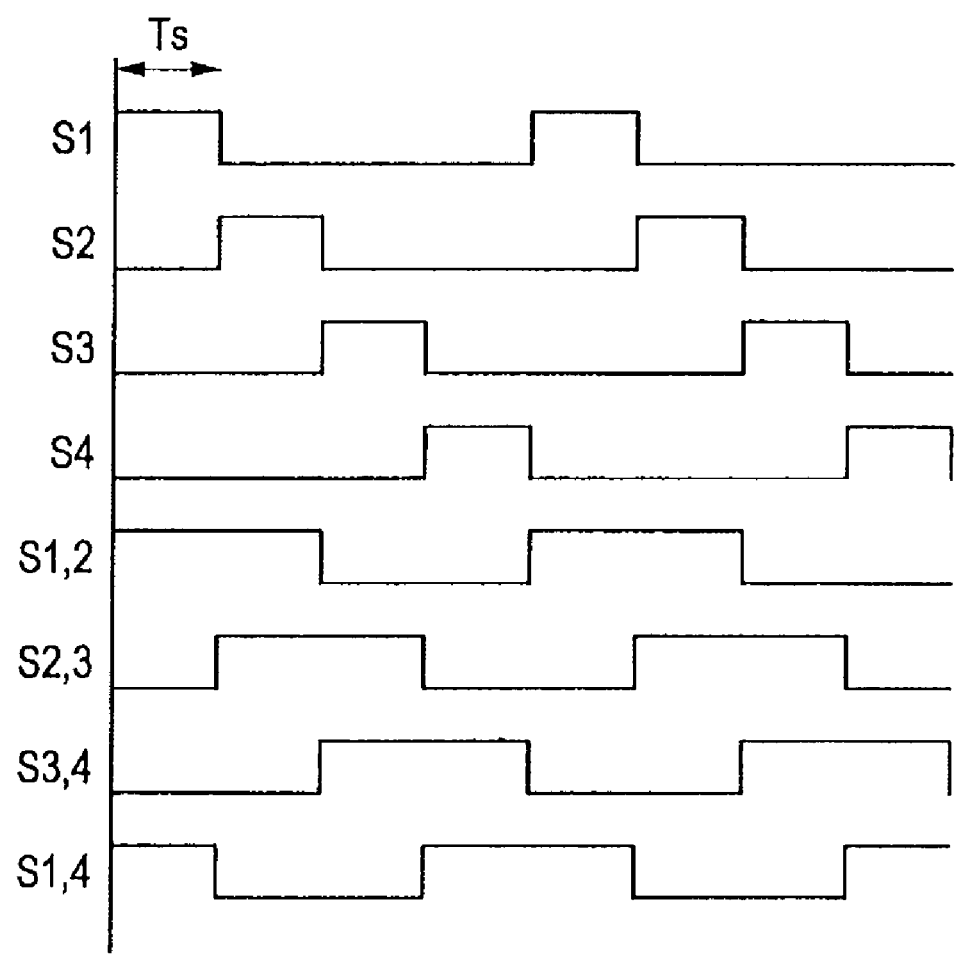
FIG. 12 is an explanatory diagram showing waveforms of clocks input to the LPF 10 shown in FIG. 11.

FIG. 11 is an explanatory diagram showing an actual circuit structure of the LPF 10 shown in FIG. 7. FIG. 12 is an explanatory diagram showing waveforms of clocks input to the LPF 10 shown in FIG. 11. The circuit structure shown in FIG. 11 is obtained by extracting only a capacitor portion from the structure shown in FIG. 7 and illustrating it. Each of the clocks shown in FIG. 12 corresponds to each of the switches shown in FIG. 11. Each of the switches shown in FIG. 11 is turned on when each of the clocks shown in FIG. 12 is in a high level state, and is turned off when each of the clocks shown in FIG. 12 is in a low level state.

An operation of the LPF 10 shown in FIG. 11 will be described. When a clock 51, a clock S1, 2 and a clock S1, 4 are in a high level state, a switch S1, a switch S1, 2 and a switch S1, 4 in FIG. 11 are turned on. When these switches are turned on, the electric charge accumulated in the capacitor Ch1 moves to the capacitor Cr1, and the electric charge accumulated in the capacitor Cr2 moves to the capacitor Ch2.

Then, when a clock S2, the clock S1, 2 and a clock S2, 3 are in a high level state, a switch S2, the switch S1, 2 and a switch S2, 3 shown in FIG. 11 are turned on. When these switches are turned on, the electric charge accumulated in the capacitor Cr1 moves to the capacitor Ch2. Further, the pole of the capacitor Cr2 that is connected to the ground (GND) is reversed. Then, the electric charge accumulated in the capacitor Ch1 moves to the capacitor Cr2 whose pole has been reversed.

Next, when a clock S3, the clock S2, 3 and a clock S3, 4 are in a high level state, a switch S3, the switch S2, 3 and a switch S3, 4 shown in FIG. 11 are turned on. When these switches are turned on, the electric charge accumulated in the capacitor Cr2 moves to the capacitor Ch2. Further, the pole of the capacitor Cr1 that is connected to the GND is reversed, and the electric charge accumulated in the capacitor Ch1 moves to the capacitor Cr1.

Next, when a clock S4, the clock S3, 4 and a clock S1, 4 are in a high level state, a switch S4, the switch S3, 4 and a switch S1, 4 shown in FIG. 11 are turned on. When these switches are turned on, the electric charge accumulated in the capacitor Cr1 moves to the capacitor Ch2. Further, the pole of the capacitor Cr2 that is connected to the GND is reversed, and the electric charge accumulated in the capacitor Ch1 moves to the capacitor Cr2.

If turning on and off of the switches is repeated in response to the switching of high and low levels of the clocks in this manner, the electric charge accumulated in the capacitor Ch1 moves to the capacitor Ch2 via the capacitors Cr1 and Cr2. As a result, the LPF 10 operates as a low pass filter that has the frequency pass characteristics shown in FIG. 10. The operation in which electric charge moves while the polarities at both ends of the capacitors Cr1 and Cr2 are switched as shown in FIG. 11 is generally called a flying capacitor method.

1-2. Problems of Charge Domain Second Order IIR-LPF According to Related Art

As described above, the charge domain second order IIR-LPF 10 according to the related art disclosed in S. Manetti and A. Liberatore, "Switched-capacitor lowpass filter without active components," Electron. Lett., 1980, 16, pp. 883-885 has an advantage that a second order IIR-LPF can be realized with a simple charge domain circuit. However, as shown in FIG. 10, the Q value of the LPF 10 of the related art is about 0.7 to 0.8, and the attenuation characteristics are moderate in the vicinity of the cut off frequency (i.e., the frequency equivalent to −3 dB). Therefore, a steep filter structure cannot be realized.

To address this, the present invention provides a charge domain LPF circuit that has steep attenuation characteristics, by making it possible to vary the Q value of the filter using parameters other than N. Hereinafter, an exemplary embodiment of the present invention will be described with reference to the appended drawings.

2. LPF According to Embodiment of the Present Invention 2-1. Structure of LPF According to Embodiment of the Present Invention FIG. 1 is an explanatory diagram showing the structure of a charge domain infinite impulse response low pass filter (IIR-LPF) 100 according to an embodiment of the present invention. Hereinafter, the structure of the charge domain IIR-LPF 100 according to the embodiment of the present invention will be described with reference to FIG. 1.

As shown in FIG. 1, the LPF 100 according to the embodiment of the present invention includes a power source 101, a transconductance amplifier gm, and capacitors Ch1, Ch2, Cr1 and Cr2.

The power source 101 is an AC power source, and outputs an input voltage signal $V_{IN}$. The transconductance amplifier gm is a transconductance amplifier that converts a voltage signal to a current signal and outputs it. The transconductance amplifier gm outputs, to an A point in FIG. 1, a current with an amplitude proportional to the input voltage signal $V_{IN}$ from the power source 101, and charges the capacitor Ch1.

The capacitors Cr1 and Cr2 move alternately between an A point side and a B point side in synchronization with a clock input to the LPF 100. Because of the capacitors Cr1 and Cr2 moving alternately between the A point side and the B point side, an electric charge can be transferred and received between the capacitor Ch1 and the capacitor Ch2. As a result, the capacitor Ch2 is charged, a voltage is generated at the B point in FIG. 1, and it is possible to output an output voltage signal $V_{OUT}$.

The LPF 100 shown in FIG. 1 is different from the LPF 10 of the related art shown in FIG. 7 in that a delay time when the capacitors Cr1 and Cr2 move from the A point side to the B point side is expressed as a J clock, and a delay time when the capacitors Cr1 and Cr2 move from the B point side to the A point side is expressed as a K clock. Note that both J and K are natural numbers that are equal to or more than 1.

2-2. Transfer Function of LPF According to Embodiment of the Present Invention

Figure 2:
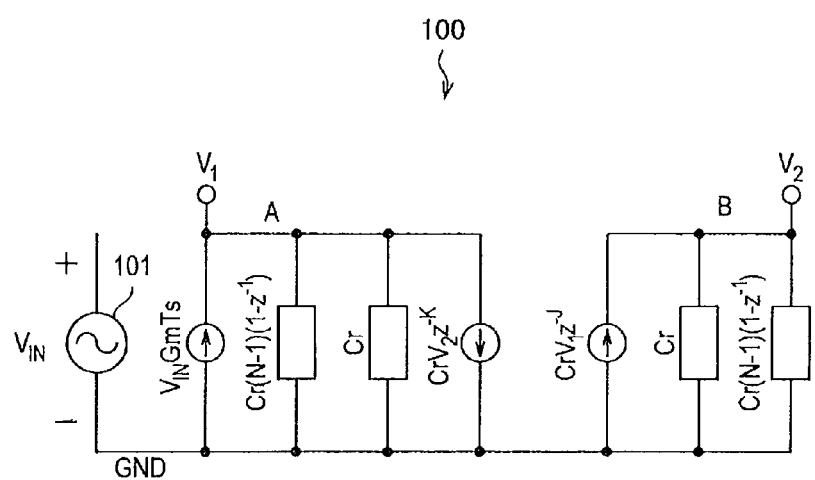
FIG. 2 is an explanatory diagram showing an equivalent circuit that is obtained by converting the LPF 100 shown in FIG. 1 to a z-domain equivalent circuit.

The structure of the charge domain IIR-LPF 100 according to the embodiment of the present invention is described above. Here, in order to obtain a transfer function of the LPF 100 shown in FIG. 1, the LPF 100 is converted to a z-domain equivalent circuit. FIG. 2 is an explanatory diagram showing an equivalent circuit that is obtained by converting the LPF 100 shown in FIG. 1 to the z-domain equivalent circuit. In the diagram shown in FIG. 2, the sampling clock cycle is denoted by Ts, the capacities of the capacitors Cr1 and Cr2 are both denoted by Cr, and the capacities of the capacitors Ch1 and Ch2 are both denoted by Cr (N−1). Further, current sources illustrated in FIG. 2 indicate that current flows in an arrow direction per one sample, and rectangles illustrated in FIG. 2 indicate conductances.

When a voltage $V_1$ at an A point in FIG. 2 and a voltage $V_2$ at a B point in FIG. 2 are calculated according to Kirchhoff's first law, the following Expression 6 and Expression 7 are obtained.

$$V_1 = \frac{V_{IN} \cdot Gm_1 \cdot Ts/Cr - V_2 \cdot z^{-K}}{N - (N-1) \cdot z^{-1}} \quad \text{Expression 6}$$

$$V_2 = \frac{V_1 \cdot z^{-J}}{N - (N-1) \cdot z^{-1}} \quad \text{Expression 7}$$

When $V_2/V_{IN}$ is obtained from the above Expression 6 and Expression 7, the following Expression 8 is obtained.

$$\frac{V_2(z)}{V_{IN}(z)} = \frac{Gm \cdot Ts}{Cr} \cdot \frac{z^{-J}}{\{N - (N-1) \cdot z^{-1}\}^2 + z^{-(J+K)}} \quad \text{Expression 8}$$

2-3. Frequency Characteristics of LPF According to Embodiment of the Present Invention Here, N=10, Ts=1.0 [ns], Gm=1.0 [mS], Ch=4.5 [pF] and Cr=0.5 [pF] are set in the equivalent circuit of the LPF 100 shown in FIG. 2. Further, if frequency characteristics of the LPF 100 are obtained from the above Expression 8, using the value of J+K as a parameter, for cases where J+K=2, 4, 6 and 8, the frequency characteristics shown in FIG. 3 are obtained.

Figure 3:
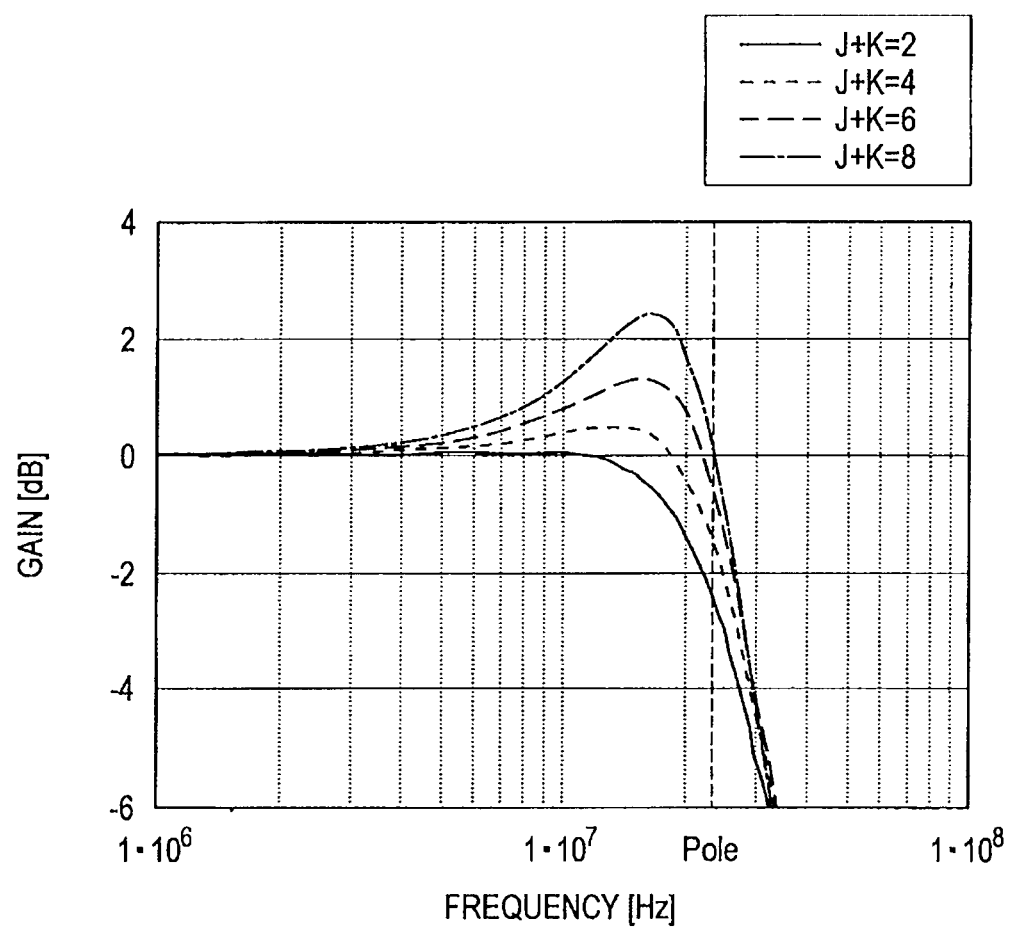
FIG. 3 is an explanatory diagram showing an example of frequency characteristics of the equivalent circuit of the LPF 100 shown in FIG. 2.

When compared to the frequency characteristics of the LPF 10 according to the related art shown in FIG. 10, it can be seen that, when J+K=2, the frequency characteristics shown in FIG. 3 are the same as the frequency characteristics of the LPF 10 according to the related art. Further, it can be seen that, when the value of J+K is increased, the gain in the vicinity of the frequency of the pole is raised, and the Q value is increased. In other words, the LPF 100 according to the present embodiment makes it possible to vary and improve the Q value by adding a delay time element to movement of the capacitors in the flying capacitor method.

If the value of J+K is set to be constant, the denominator of the above Expression 8 is the same, but the numerator varies because the multiplier of z varies depending on the value of J. "$z^{-J}$" indicates a delay of J clocks. For example, when J+K=4, there are three combination patterns of J and K, i.e., (J, K)=(1, 3), (2, 2) and (3, 1). Accordingly, if the value of J+K is set to be constant, it is possible to obtain the charge domain second order IIR-LPF that has transfer characteristics in which frequency characteristics are the same, but only delay times are different from each other. By using the values of J and K that are set in this way, it is also possible to vary the delay time of movement of the capacitors in the flying capacitor method.

Figure 4:
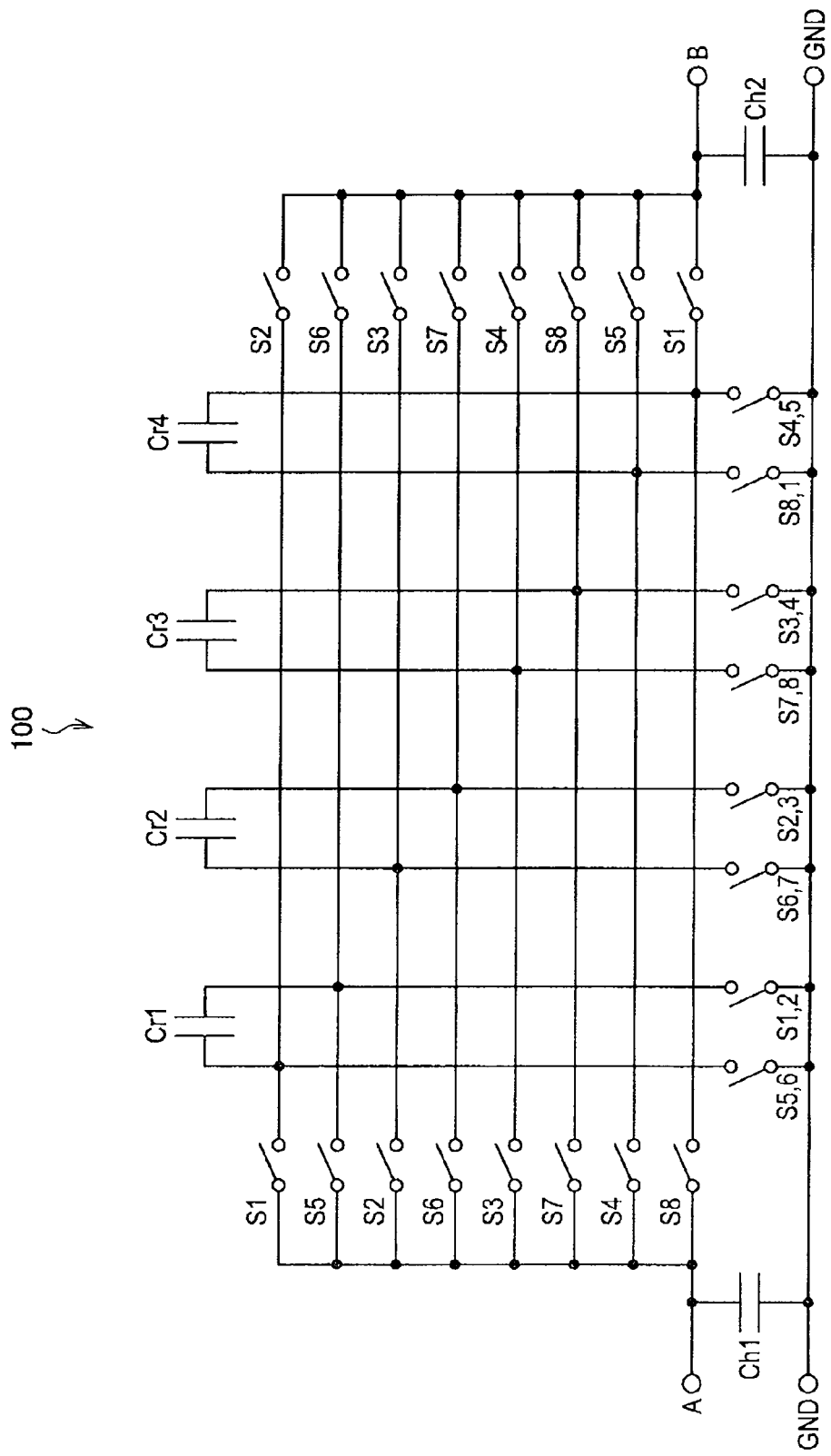
FIG. 4 is an explanatory diagram showing an example of the circuit structure of the LPF 100 according to the embodiment of the present invention.
Figure 5:
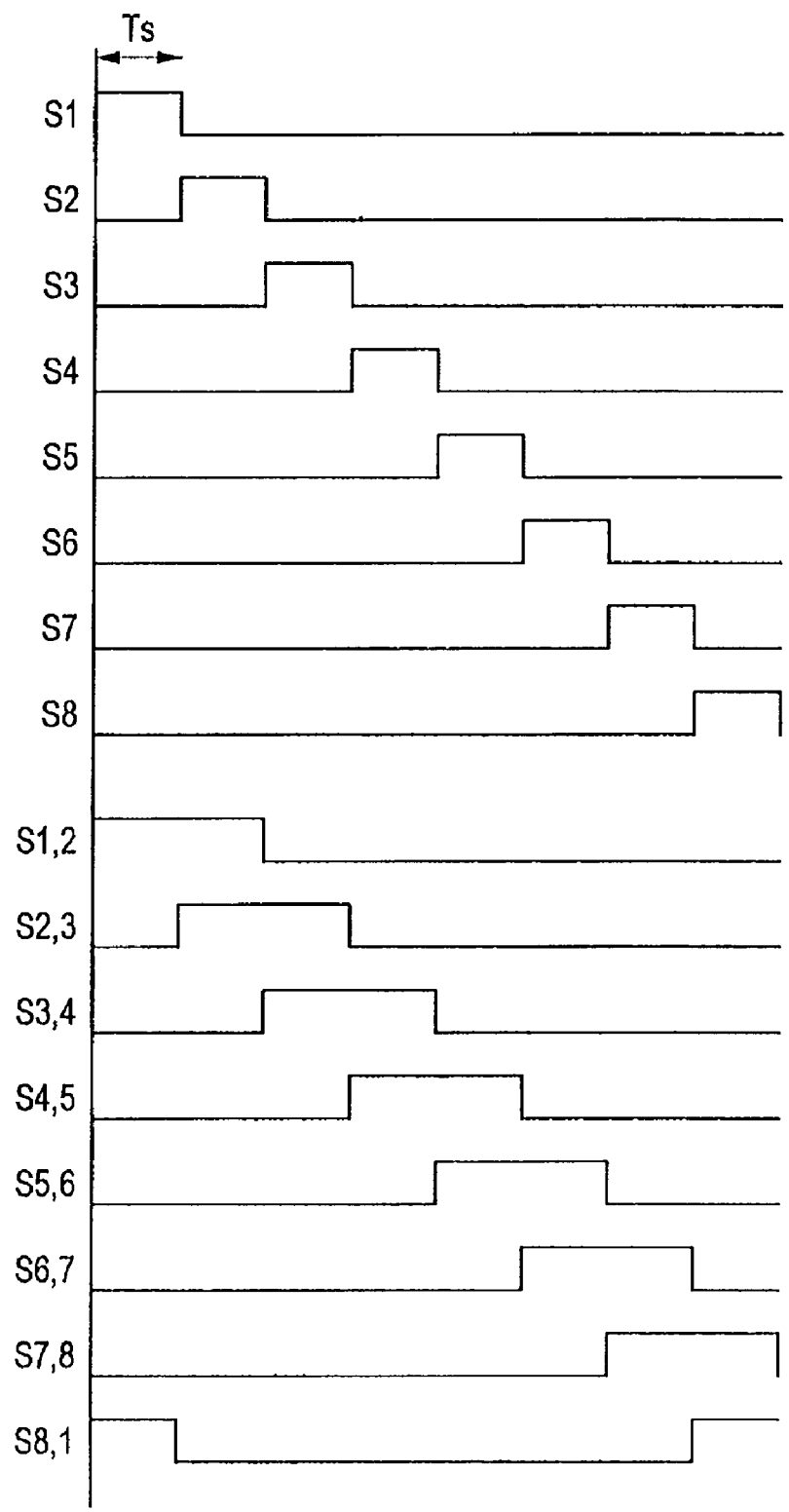
FIG. 5 is an explanatory diagram showing waveforms of clocks input to the LPF 100 shown in FIG. 4.

2-4. Example of Circuit Structure of LPF According to Embodiment of the Present Invention Next, an example of the circuit structure of the LPF 100 according to the embodiment of the present invention will be described. FIG. 4 is an explanatory diagram showing an example of the circuit structure of the LPF 100 according to the embodiment of the present invention. The structure shown in FIG. 4 illustrates a case where J=1 and K=3 in the LPF 100 shown in FIG. 1, and is obtained by extracting a capacitor portion of the LPF 100 shown in FIG. 1. FIG. 5 is an explanatory diagram showing waveforms of clocks input to the LPF 100 shown in FIG. 4. Each of the clocks shown in FIG. 5 corresponds to each of the switches shown in FIG. 4. Each of the switches shown in FIG. 4 is turned on when each of the clocks shown in FIG. 5 is in a high level state, and is turned off when each of the clocks shown in FIG. 5 is in a low level state.

An operation of the LPF 100 shown in FIG. 4 will be described. When a clock S1, a clock S1, 2 and a clock S8, 1 are in a high level state, a switch S1, a switch S1, 2 and a switch S8, 1 in FIG. 4 are turned on. When these switches are turned on, the electric charge accumulated in the capacitor Ch1 moves to the capacitor Cr1, and the electric charge accumulated in the capacitor Cr4 moves to the capacitor Ch2.

Next, when a clock S2, the clock S1, 2 and a clock S2, 3 are in a high level state, a switch S2, the switch S1, 2 and a switch S2, 3 shown in FIG. 4 are turned on. When these switches are turned on, the electric charge accumulated in the capacitor Cr1 moves to the capacitor Ch2. More specifically, after one clock from when the electric charge of the capacitor Ch1 is accumulated in the capacitor Cr1, the electric charge accumulated in the capacitor Cr1 moves to the capacitor Ch2. Further, in response to the turning on of the switch S2 and the switch S2, 3, the electric charge accumulated in the capacitor Ch1 moves to the capacitor Cr2 that is connected to the capacitor Ch1.

Next, when a clock S3, the clock S2, 3 and a clock S3, 4 are in a high level state, a switch S3, the switch S2, 3 and a switch S3, 4 shown in FIG. 4 are turned on. When these switches are turned on, the electric charge accumulated in the capacitor Cr2 moves to the capacitor Ch2. More specifically, after one clock from when the electric charge of the capacitor Ch1 is accumulated in the capacitor Cr2, the electric charge accumulated in the capacitor Cr2 moves to the capacitor Ch2. Further, in response to the turning on of the switch S3 and the switch S3, 4, the electric charge accumulated in the capacitor Ch1 moves to the capacitor Cr3 that is connected to the capacitor Ch1.

Next, when a clock S4, the clock S3, 4 and a clock S4, 5 are in a high level state, a switch S4, the switch S3, 4 and a switch S4, 5 shown in FIG. 4 are turned on. When these switches are turned on, the electric charge accumulated in the capacitor Cr3 moves to the capacitor Ch2. More specifically, after one clock from when the electric charge of the capacitor Ch1 is accumulated in the capacitor Cr3, the electric charge of the capacitor Cr3 moves to the capacitor Ch2. Further, in response to the turning on of the switch S4 and the switch S4, 5, the electric charge accumulated in the capacitor Ch1 moves to the capacitor Cr4 that is connected to the capacitor Ch1. Note that a pole of the capacitor Cr4, which is opposite to the pole that was connected to the GND when the electric charge moved to the capacitor Ch2, is connected to the capacitor Ch1 in a state where it is connected to the GND. Accordingly, after three clocks from when the accumulated electric charge moves to the capacitor Ch2, the capacitor Cr4 is connected to the capacitor Ch1 in a state where the polarity of the capacitor Cr4 is reversed.

Next, when a clock S5, the clock S4, 5 and a clock S5, 6 are in a high level state, a switch S5, the switch S4, 5 and a switch S5, 6 shown in FIG. 4 are turned on. When these switches are turned on, the electric charge accumulated in the capacitor Cr4 moves to the capacitor Ch2. More specifically, after one clock from when the electric charge of the capacitor Ch1 is accumulated in the capacitor Cr4, the electric charge of the capacitor Cr4 moves to the capacitor Ch2. Further, in response to the turning on of the switch S5 and the switch S5, 6, the electric charge accumulated in the capacitor Ch1 moves to the capacitor Cr1 that is connected to the capacitor Ch1. Note that a pole of the capacitor Cr1, which is opposite to the pole that was connected to the GND when the electric charge moved to the capacitor Ch2, is connected to the capacitor Ch1 in a state where it is connected to the GND. Accordingly, after three clocks from when the accumulated electric charge moves to the capacitor Ch2, the capacitor Cr1 is connected to the capacitor Ch1 in a state where the polarity of the capacitor Cr1 is reversed.

Next, when a clock S6, the clock S5, 6 and a clock S6, 7 are in a high level state, a switch S6, the switch S5, 6 and a switch S6, 7 shown in FIG. 4 are turned on. When these switches are turned on, the electric charge accumulated in the capacitor Cr1 moves to the capacitor Ch2. More specifically, after one clock from when the electric charge of the capacitor Ch1 is accumulated in the capacitor Cr1, the electric charge of the capacitor Cr1 moves to the capacitor Ch2. Further, in response to the turning on of the switch S6 and the switch S6, 7, the electric charge accumulated in the capacitor Ch1 moves to the capacitor Cr2 that is connected to the capacitor Ch1. Note that a pole of the capacitor Cr2, which is opposite to the pole that was connected to the GND when the electric charge moved to the capacitor Ch2, is connected to the capacitor Ch1 in a state where it is connected to the GND. Accordingly, after three clocks from when the accumulated electric charge moves to the capacitor Ch2, the capacitor Cr2 is connected to the capacitor Ch1 in a state where the polarity of the capacitor Cr2 is reversed.

Next, when a clock S7, the clock S6, 7 and a clock S7, 8 are in a high level state, a switch S7, the switch S6, 7 and a switch S7, 8 shown in FIG. 4 are turned on. When these switches are turned on, the electric charge accumulated in the capacitor Cr2 moves to the capacitor Ch2. More specifically, after one clock from when the electric charge of the capacitor Ch1 is accumulated in the capacitor Cr2, the electric charge of the capacitor Cr2 moves to the capacitor Ch2. Further, in response to the turning on of the switch S7 and the switch S7, 8, the electric charge accumulated in the capacitor Ch1 moves to the capacitor Cr3 that is connected to the capacitor Ch1. Note that a pole of the capacitor Cr3, which is opposite to the pole that was connected to the GND when the electric charge moved to the capacitor Ch2, is connected to the capacitor Ch1 in a state where it is connected to the GND. Accordingly, after three clocks from when the accumulated electric charge moves to the capacitor Ch2, the capacitor Cr3 is connected to the capacitor Ch1 in a state where the polarity of the capacitor Cr3 is reversed.

Next, when a clock S8, the clock S7, 8 and the clock S8, 1 are in a high level state, a switch S8, the switch S7, 8 and the switch S8, 1 shown in FIG. 4 are turned on. When these switches are turned on, the electric charge accumulated in the capacitor Cr3 moves to the capacitor Ch2. More specifically, after one clock from when the electric charge of the capacitor Ch1 is accumulated in the capacitor Cr3, the electric charge of the capacitor Cr3 moves to the capacitor Ch2. Further, in response to the turning on of the switch S8 and the switch S8, 1, the electric charge accumulated in the capacitor Ch1 moves to the capacitor Cr4 that is connected to the capacitor Ch 1. Note that a pole of the capacitor Cr4, which is opposite to the pole that was connected to the GND when the electric charge moved to the capacitor Ch2, is connected to the capacitor Ch1 in a state where it is connected to the GND. Accordingly, after three clocks from when the accumulated electric charge moves to the capacitor Ch2, the capacitor Cr4 is connected to the capacitor Ch1 in a state where the polarity of the capacitor Cr4 is reversed.

If turning on and off of the switches is repeated in accordance with changes in high and low levels of each clock in this manner, it is possible to realize the LPF 100 shown in FIG. 1. If the capacity of each capacitor and the switching timing of each switch are adjusted appropriately, and the turning on and off of each switch is switched to transfer and receive an electric charge between the capacitors, it is possible to realize the LPF having the frequency characteristics shown in FIG. 3. In addition, by controlling the timing (the delay time) of movement of the capacitors Cr1, Cr2, Cr3 and Cr4 from the A point side to the B point side or from the B point side to the A point side, it is possible to realize a low pass filter in which frequency characteristics are the same, but only delay times are different.

Figure 6:
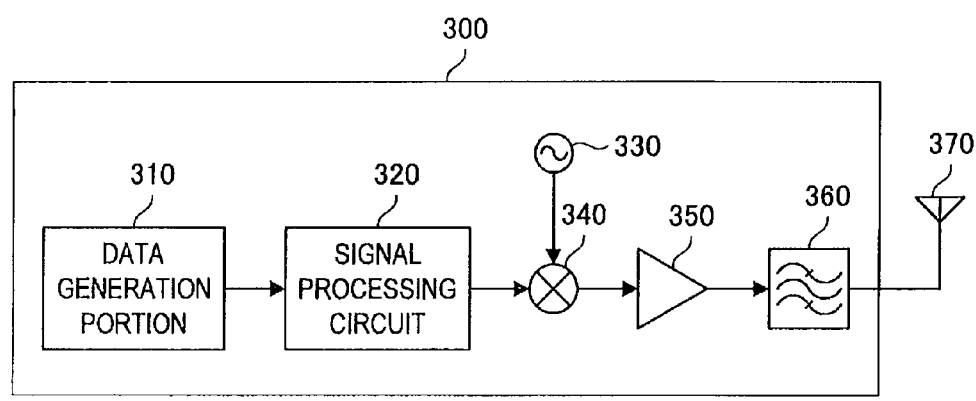
FIG. 6 is an explanatory diagram showing the structure of a communication device 300 provided with the LPF according to the embodiment of the present invention.

3. Communication Device Provided with LPF According to Embodiment of the Present Invention Next, the structure of a communication device provided with the LPF according to the embodiment of the present invention will be described. FIG. 6 is an explanatory diagram showing the structure of a communication device 300 provided with the LPF according to the embodiment of the present invention.

As shown in FIG. 6, the communication device 300 provided with the LPF according to the embodiment of the present invention includes a data generation portion 310, a signal processing circuit 320, a local signal generator 330, a frequency converter 340, a power amplifier 350, a band limiting filter 360 and an antenna 370.

Data to be transmitted from the communication device 300 is generated in the data generation portion 310 and is input to the signal processing circuit 320. In the signal processing circuit 320, processing such as D/A conversion, encoding and modulation is performed. Thus, a transmission signal in a base band or in an intermediate frequency (IF) band is generated. The transmission signal from the signal processing circuit 320 is input to the frequency converter (mixer) 340, and is multiplied by a local signal from the local signal generator 330. As a result of multiplication of the transmission signal by the local signal, the transmission signal is converted to a radio frequency (RF) band signal, namely, up-converted.

The RF signal that is obtained by up-conversion in the frequency converter 340 is amplified by the power amplifier 350, and is then input to the band limiting filter 360. After the RF signal is subjected to band limitation by the band limiting filter 360 and unnecessary frequency components are thereby removed, the resultant RF signal is supplied to the antenna 370. Note that various types of charge domain second order IIR-LPF circuits described above can be used as the band limiting filter 360.

4. Conclusion

As described above, according to the embodiment of the present invention, the Q value of the filter can be varied by setting, as a parameter, the delay time of movement of the capacitors in the flying capacitor method. Thus, it is possible to obtain the LPF 100 having steep attenuation characteristics. Moreover, if the sum of a delay time when the capacitors move from the input side to the output side and a delay time when the capacitors move from the output side to the input side is set to be constant, it is possible to obtain transfer characteristics in which frequency characteristics are the same, but only delay times are different. Therefore, the LPF 100 according to the embodiment of the present invention makes it possible to vary the delay time, unlike the charge domain second order IIR-LPF according to the related art.

It should be understood by those skilled in the art that various modifications, combinations, sub-combinations and alterations may occur depending on design requirements and other factors insofar as they are within the scope of the appended claims or the equivalents thereof.

The present invention is applicable to a filter circuit and a communication device, and particularly applicable to a filter circuit that uses a flying capacitor, and a communication device provided with the filter circuit that uses the flying capacitor.

The present application contains subject matter related to that disclosed in Japanese Priority Patent Application JP 2008-326199 filed in the Japan Patent Office on 22 Dec. 2008, the entire content of which is hereby incorporated by reference.

What is claimed is:

1. A filter circuit comprising:
  a flying capacitor which maintains polarity when switching from an input terminal to an output terminal, and the polarity of which is reversed when switching from the output terminal to the input terminal;
  a first capacitor that is provided in parallel with the flying capacitor, at the input terminal of the flying capacitor;
  a second capacitor that is provided in parallel with the flying capacitor, at the output terminal of the flying capacitor, and
  a clock circuit to switch the flying capacitor from the input terminal to the output terminal with a delay of a predetermined time after the switching from the output terminal to the input terminal, the clock circuit switching the flying capacitor from the output terminal to the input terminal with a delay of a predetermined time after the switching from the input terminal to the output terminal, the clock circuit switching the flying capacitor from the input terminal to the output terminal with a delay of J clocks, J being a natural number of 1 or more, of a clock cycle input to the flying capacitor after the switching from the output terminal to the input terminal, and the clock circuit switching the flying capacitor from the output terminal to the input terminal with a delay of K clocks, K being a natural number of 1or more, of the clock cycle after the switching from the input terminal to the output terminal, and J+K>2.

2. The filter circuit according to claim 1, wherein a value of J is variable.

3. The filter circuit according to claim 1, wherein a value of J is variable, and a sum of J and K is constant.

4. The filter circuit according to claim 1, wherein a value of J is variable, and a value of K is constant.

5. A communication device comprising:
  the filter circuit according to claim 1.

6. The filter circuit according to claim 1, wherein J+K=4.

* * * * *